(12) United States Patent
Masuda et al.

(10) Patent No.: US 8,921,932 B2
(45) Date of Patent: Dec. 30, 2014

(54) SEMICONDUCTOR DEVICE

(71) Applicant: Sumitomo Electric Industries, Ltd., Osaka (JP)

(72) Inventors: Takeyoshi Masuda, Osaka (JP); Keiji Wada, Osaka (JP); Toru Hiyoshi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/863,178

(22) Filed: Apr. 15, 2013

(65) Prior Publication Data

US 2013/0307065 A1 Nov. 21, 2013

Related U.S. Application Data

(60) Provisional application No. 61/649,070, filed on May 18, 2012.

(30) Foreign Application Priority Data

May 18, 2012 (JP) ................................. 2012-114126

(51) Int. Cl.
| | |
|---|---|
| H01L 29/66 | (2006.01) |
| H01L 27/088 | (2006.01) |
| H01L 21/04 | (2006.01) |
| H01L 29/417 | (2006.01) |
| H01L 29/423 | (2006.01) |
| H01L 29/78 | (2006.01) |
| H01L 29/06 | (2006.01) |
| H01L 29/10 | (2006.01) |
| H01L 29/45 | (2006.01) |
| H01L 29/16 | (2006.01) |

(52) U.S. Cl.
CPC ............ *H01L 27/088* (2013.01); *H01L 21/049* (2013.01); *H01L 29/41766* (2013.01); *H01L 29/42376* (2013.01); *H01L 29/4238* (2013.01); *H01L 29/66068* (2013.01); *H01L 29/7813* (2013.01); *H01L 29/0696* (2013.01); *H01L 29/1095* (2013.01); *H01L 29/4236* (2013.01); *H01L 29/45* (2013.01); *H01L 29/0619* (2013.01); *H01L 29/1608* (2013.01)
USPC .......................................... 257/331; 257/339

(58) Field of Classification Search
USPC .............................................. 257/77, 331, 339
See application file for complete search history.

(56) References Cited

U.S. PATENT DOCUMENTS 5,338,945 A * 8/1994 Baliga et al. .................... 257/77
2005/0233539 A1 10/2005 Takeuchi et al.
(Continued)

FOREIGN PATENT DOCUMENTS

| JP | 2000-509559 A | 7/2000 |
| JP | 2001-102576 A | 4/2001 |

(Continued)

OTHER PUBLICATIONS

Masuda et al., U.S. Appl. No. 13/863,143, "Semiconductor Device," Filed Apr. 15, 2013.

(Continued)

*Primary Examiner* — Mark Prenty
(74) *Attorney, Agent, or Firm* — Venable LLP; Michael A. Sartori; Tamatane J. Aga

(57) ABSTRACT

The substrate is made of a compound semiconductor and has a plurality of first recesses, each of which opens at one main surface thereof and has a first side wall surface. The gate insulating film is disposed on and in contact with the first side wall surface. The gate electrode is disposed on and in contact with the gate insulating film. The substrate include: a source region having first conductivity type and disposed to face itself with a first recess interposed therebetween, when viewed in a cross section along the thickness direction; and a body region having second conductivity type and disposed to face itself with the first recess interposed therebetween. Portions of the source region facing each other are connected to each other in a region interposed between the first recess and another first recess adjacent to the first recess, when viewed in a plan view.

6 Claims, 7 Drawing Sheets

(56) References Cited

U.S. PATENT DOCUMENTS

| | | |
|---|---|---|
| 2007/0015333 A1 | 1/2007 | Kishimoto et al. |
| 2012/0309195 A1 | 12/2012 | Masuda |

FOREIGN PATENT DOCUMENTS

| | | |
|---|---|---|
| JP | 2005-328013 A | 11/2005 |
| JP | 2006-351744 A | 12/2006 |
| JP | 2007-165657 A | 6/2007 |
| JP | 2007-258465 A | 10/2007 |
| JP | 2010-040564 A | 2/2010 |
| WO | WO-97/47045 A1 | 12/1997 |
| WO | WO-2012/017958 A1 | 2/2012 |

OTHER PUBLICATIONS

International Search Report and Written Opinion in International Application No. PCT/JP2013/060469 dated Jul. 9, 2013.
International Search Report and Written Opinion in International Application No. PCT/JP2013/060471 dated Jul. 9, 2013.
Office Action issued in U.S. Appl. No. 13/863,143 dated Jul. 18, 2014.

* cited by examiner (A)

(B)

SEMICONDUCTOR DEVICE

BACKGROUND OF THE INVENTION

1. Field of the Invention

The present invention relates to a semiconductor device, more particularly, a semiconductor device allowing for size reduction.

2. Description of the Background Art

In recent years, in order to achieve high breakdown voltage, low loss, and the like in a semiconductor device, silicon carbide has begun to be adopted as a material for the semiconductor device. Silicon carbide is a wide band gap semiconductor having a band gap larger than that of silicon, which has been conventionally widely used as a material for semiconductor devices. Hence, by adopting silicon carbide as a material for a semiconductor device, the semiconductor device can have a high breakdown voltage, reduced on-resistance, and the like.

An exemplary semiconductor device employing silicon carbide as its material is a MOSFET (Metal Oxide Semiconductor Field Effect Transistor) or the like. The MOSFET is a semiconductor device that controls existence/non-existence of an inversion layer in a channel region in accordance with a predetermined threshold voltage so as to conduct and interrupt a current. For example, Japanese Patent Laying-Open No. 2005-328013 describes a trench gate type MOSFET in which a channel region is formed along a trench wall surface.

SUMMARY OF THE INVENTION

In the MOSFET described in Japanese Patent Laying-Open No. 2005-328013, an ohmic electrode is provided in ohmic contact with each of cells surrounded by the gate trench. In this MOSFET, a region in which the ohmic electrode is to be formed needs to be secured on each cell. This makes it difficult to attain size reduction of the cells.

The present invention has been made in view of the foregoing problem, and has its object to provide a semiconductor device allowing for size reduction of cells.

A semiconductor device according to the present invention includes a substrate, a gate insulating film, and a gate electrode. The substrate is made of a compound semiconductor and has a plurality of first recesses, each of which opens at one main surface thereof and has a first side wall surface. The gate insulating film is disposed on and in contact with the first side wall surface. The gate electrode is disposed on and in contact with the gate insulating film. The substrate includes: a source region having first conductivity type and disposed to be exposed at the first side wall surface and face itself with a first recess interposed therebetween, when viewed in a cross section along a thickness direction; and a body region having second conductivity type and disposed in contact with the source region at a side opposite to the one main surface when viewed from the source region, so as to be exposed at the first side wall surface and face itself with the first recess interposed therebetween. Portions of the source region facing each other with the first recess interposed therebetween are connected to each other in a region interposed between the first recess and another first recess adjacent to the first recess when viewed in a plan view.

According to the semiconductor device in the present invention, when viewed in a plan view, the portions of the source region facing each other with the first recess interposed therebetween are connected to each other in the region interposed between the first recess and the another first recess adjacent to the first recess. Hence, by providing an ohmic electrode in contact with one of the portions of the source region facing each other with the first recess interposed therebetween, current can flow in both the portions of the source region without providing an ohmic electrode for the other portion thereof. As a result, the number of cells provided with ohmic electrodes can be reduced, thus achieving size reduction of cells.

Preferably in the above-described semiconductor device, the substrate is further provided with a second recess having a second side wall surface. The source region is exposed at the second side wall surface. The semiconductor device further includes an ohmic electrode, which is formed on the second side wall surface and makes ohmic contact with the source region.

According to the above-described semiconductor device, the ohmic electrode is provided in contact with the second side wall surface of the second recess. Accordingly, a cell provided with the ohmic electrode and a cell in which a channel is formed are provided independently, thus achieving further size reduction of cells.

Preferably, the above-described semiconductor device further includes a high-concentration second conductivity type region, which makes contact with the ohmic electrode and the body region. Accordingly, the potential of the body region making contact with the high-concentration second conductivity type region can be fixed to a desired value.

Preferably in the above-described semiconductor device, the high-concentration second conductivity type region has a bottom surface disposed at a location further away from the one main surface relative to a first bottom wall surface of the first recess. Accordingly, a depletion layer extends from a pn junction between the high-concentration second conductivity type region and the drift region of the first conductivity type, thereby relaxing electric field concentration on the first bottom wall surface of the first recess.

Preferably in the above-described semiconductor device, portions of the body region facing each other with the first recess interposed therebetween are connected to each other in the region interposed between the first recess and the another first recess adjacent to the first recess when viewed in a plan view. Accordingly, electric field concentration can be relaxed in a boundary between two adjacent ones of the first side wall surfaces forming the first recesses.

Preferably in the above-described semiconductor device, the substrate is further provided with a third recess that opens at the one main surface and has a third side wall surface. The substrate further includes an electric field relaxing region, which has the second conductivity type and is disposed in contact with the third side wall surface of the third recess and the body region. By thus providing the cell specialized in electric field relaxation, electric field concentration can be suppressed more securely.

Preferably in the above-described semiconductor device, the electric field relaxing region has a bottom surface disposed at a location further away from the one main surface relative to a first bottom wall surface of the first recess. Accordingly, a depletion layer extends from a pn junction between the electric field relaxing region of the second conductivity type and the drift region of the first conductivity type, thereby relaxing electric field concentration on the first bottom wall surface of the first recess.

As apparent from the description above, according to the semiconductor device in the present invention, size reduction of cells can be achieved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
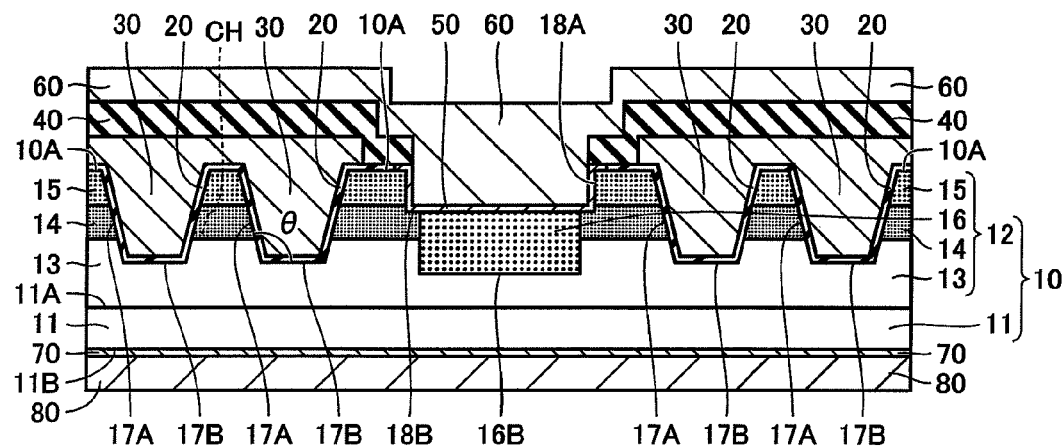
FIG. 1 is a schematic cross sectional view showing a structure of a semiconductor device of a first embodiment.

The following describes embodiments of the present invention with reference to figures. It should be noted that in the below-mentioned figures, the same or corresponding portions are given the same reference characters and are not described repeatedly. Further, in the present specification, an individual orientation is represented by [ ], a group orientation is represented by < >, and an individual plane is represented by ( ) and a group plane is represented by { }. In addition, a negative index is supposed to be crystallographically indicated by putting "-" (bar) above a numeral, but is indicated by putting the negative sign before the numeral in the present specification.

(First Embodiment)

Figure 9:
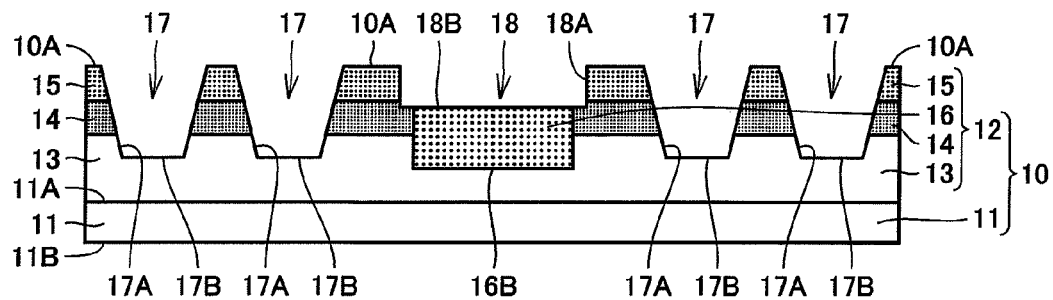
FIG. 9 is a schematic cross sectional view for illustrating a fifth step of the method for manufacturing the semiconductor device in the first embodiment (cross sectional view of a region of FIG. 2 along IX-IX).
Figure 10:
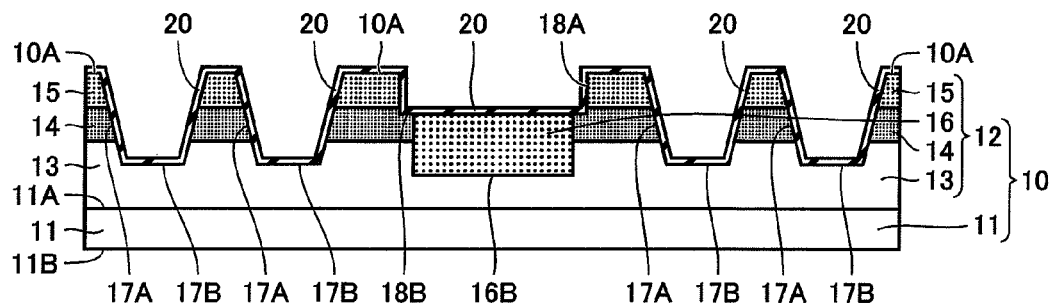
FIG. 10 is a schematic cross sectional view for illustrating a sixth step of the method for manufacturing the semiconductor device in the first embodiment.
Figure 11:
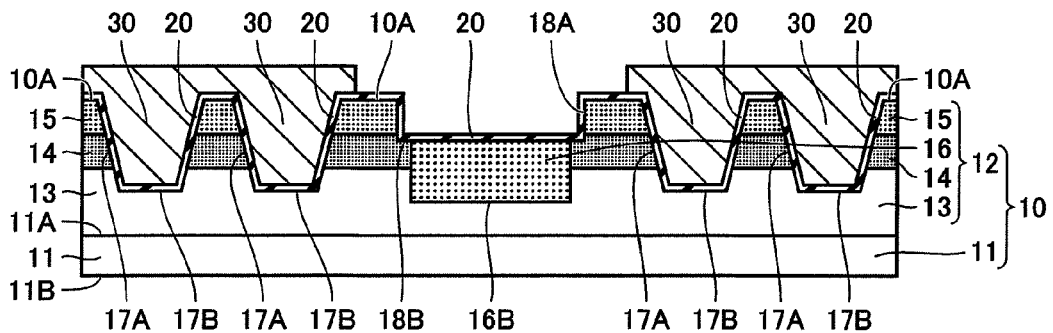
FIG. 11 is a schematic cross sectional view for illustrating a seventh step of the method for manufacturing the semiconductor device in the first embodiment.
Figure 12:
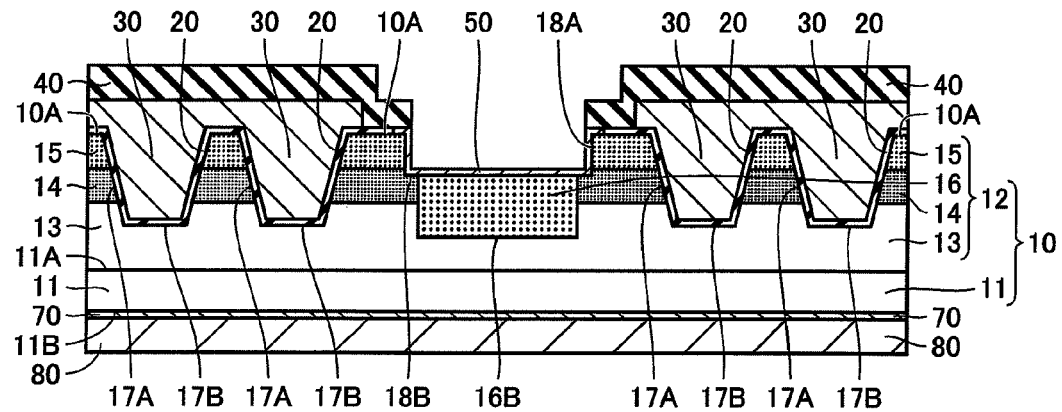
FIG. 12 is a schematic cross sectional view for illustrating an eighth step of the method for manufacturing the semiconductor device in the first embodiment.

First, a first embodiment, which is one embodiment of the present invention, will be described. First, referring to FIG. 1, the following describes a structure of a MOSFET 1 serving as a semiconductor device according to the first embodiment. MOSFET 1 includes a substrate 10 made of a compound semiconductor and having a main surface 10A, a gate insulating film 20, a gate electrode 30, an interlayer insulating film 40, an ohmic electrode 50, a source pad electrode 60, a drain electrode 70, and a drain pad electrode 80. Substrate 10 includes a base substrate 11 and a semiconductor layer 12. In semiconductor layer 12, a drift region 13, a body region 14, a source region 15, and a high-concentration second conductivity type region 16 are formed. Further, substrate 10 is provided with a plurality of first recesses 17 (see FIG. 9), each of which opens at the main surface 10A side and has first side wall surfaces 17A and a first bottom wall surface 17B. Further, substrate 10 is provided with a second recess 18 (see FIG. 9), which opens at the main surface 10A side and has second side wall surfaces 18A and a second bottom wall surface 18B.

Base substrate 11 is made of, for example, silicon carbide, contains an n type impurity such as N (nitrogen), and therefore has n type conductivity (first conductivity type). Drift region 13 is formed on a main surface 11A of base substrate 11. As with base substrate 11, drift region 13 contains an n type impurity such as N (nitrogen), and therefore has n type conductivity. The concentration thereof in drift region 13 is lower than that in base substrate 11.

Body region 14 is formed on and in contact with drift region 13 (at a side opposite to the base substrate 11 side). Body region 14 contains a p type impurity such as Al (aluminum) or B (boron), and therefore has p type conductivity (second conductivity type). When viewed in a cross section in the thickness direction of substrate 10 (i.e., in a plane parallel to the plane of sheet of FIG. 1), body region 14 is exposed at first side wall surfaces 17A of first recesses 17, and is disposed to face itself with a first recess 17 interposed therebetween. It should be noted that when viewed from source region 15, body region 14 is disposed at a side opposite to main surface 10A.

Source region 15 is formed on and in contact with body region 14 (at a side opposite to the drift region 13 side). Source region 15 contains an n type impurity such as P (phosphorus), and therefore has n type conductivity (first conductivity type) as with base substrate 11 and drift region 13. Further, the concentration of the n type impurity in source region 15 is higher than that in drift region 13. When viewed in the cross section in the thickness direction of substrate 10, source region 15 is exposed at first side wall surfaces 17A of first recesses 17, and is disposed to face itself with first recess 17 interposed therebetween.

High-concentration second conductivity type region 16 is formed in contact with body region 14 and drift region 13 in semiconductor layer 12 so as to extend to a region deeper than first recess 17. Specifically, high-concentration second conductivity type region 16 is disposed in contact with ohmic electrode 50, extends through body region 14, and has a contact surface (i.e., bottom surface 16B of high-concentration second conductivity type region 16) making contact with drift region 13 and disposed at a location further away from main surface 10A relative to first bottom wall surface 17B of first recess 17. As with body region 14, high-concentration second conductivity type region 16 contains a p type impurity such as Al (aluminum) and therefore has p type conductivity. The concentration thereof in high-concentration second conductivity type region 16 is higher than that in body region 14.

Each of first recesses 17 is formed to extend through source region 15 and body region 14 and reach drift region 13. Specifically, first recess 17 is formed such that first bottom wall surface 17B is disposed closer to ohmic electrode 50 relative to bottom surface 16B of high-concentration second conductivity type region 16. Further, as shown in FIG. 1, first recess 17 is formed such that first side wall surface 17A and first bottom wall surface 17B form an angle θ larger than 90°. In other words, first recess 17 is formed such that first side wall surface 17A and main surface 10A of substrate 10 form an angle larger than 90°.

Second recess 18 is formed to extend through source region 15 and reach body region 14. Specifically, high-concentration second conductivity type region 16 is formed to extend from second bottom wall surface 18B of second recess 18 toward drain electrode 70. Further, as shown in FIG. 1, second side wall surface 18A and second bottom wall surface 18B form an angle of approximately 90°. At second side wall surface 18A of second recess 18, source region 15 is exposed.

Figure 2:
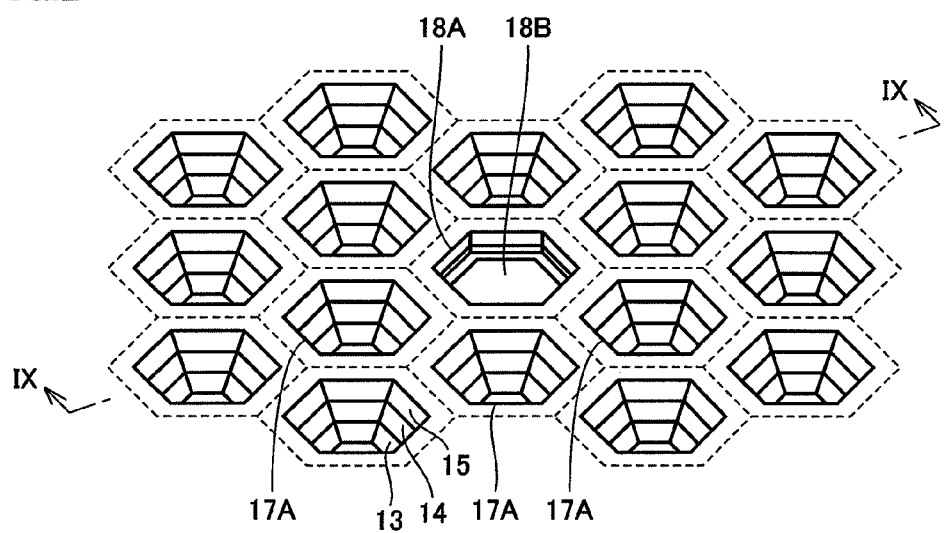
FIG. 2 is a perspective view schematically showing a structure of a substrate of the semiconductor device of the first embodiment.
Figure 3:
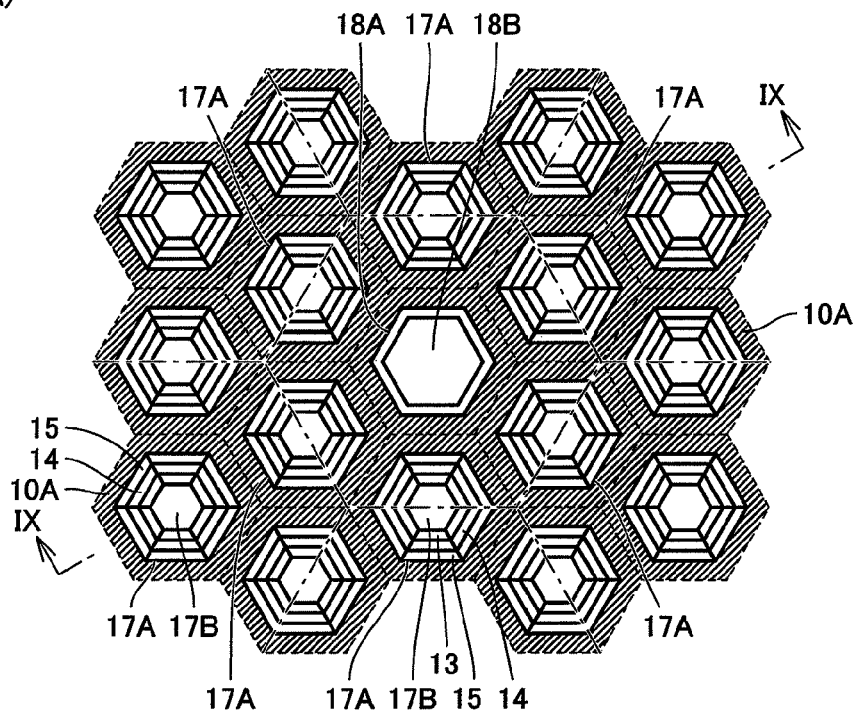
FIG. 3(A) is a plan view schematically showing a structure of a source region of the substrate of the semiconductor device of the first embodiment.
FIG. 3(B) is a plan view schematically showing structures of cells.
Figure 3:
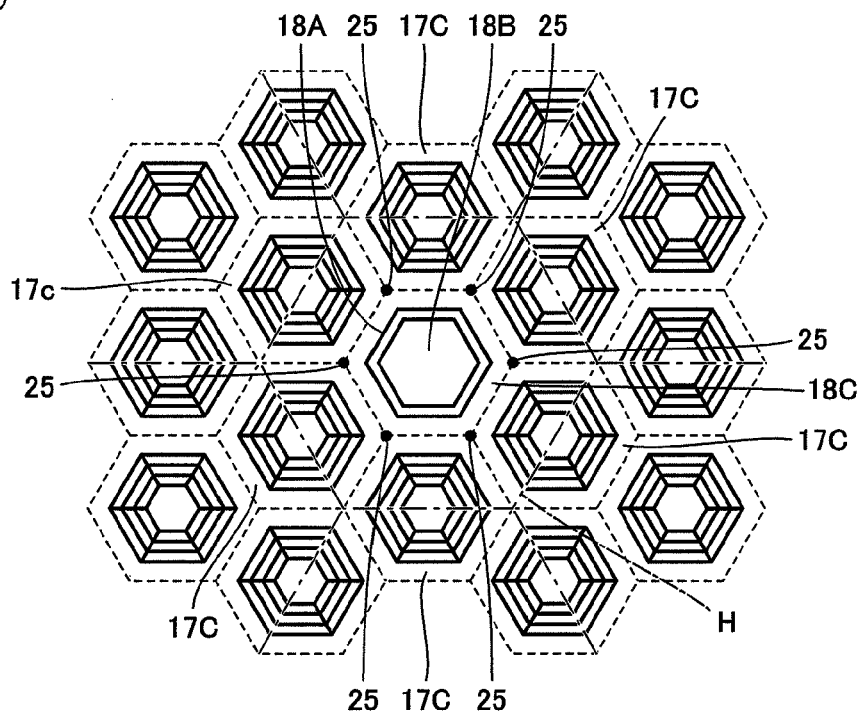

Next, referring to FIG. 2 and FIG. 3, the shapes of first recess 17 and second recess 18 will be described. As shown in FIG. 2 and FIG. 3, each of first recess 17 and second recess 18 has a hexagonal planar shape, for example. At first side wall surface 17A of first recess 17, source region 15, body region 14, and drift region 13 are exposed. At the wall surface of second recess 18, source region 15 is exposed. At second bottom wall surface 18B of second recess 18, body region 14 is exposed.

Referring to FIG. 3(A), a planar structure of source region 15 will be described. Here, FIG. 3(A) and FIG. 3(B) are plan views of the same field of view in a direction perpendicular to main surface 10A of substrate 10. In FIG. 3(A), the exposed portion of source region 15 in main surface 10A is shaded by diagonal lines so as to illustrate the structure of source region 15. FIG. 3(B) is a figure for illustrating structures of cells, and therefore source region 15 is not shaded by the diagonal lines. As shown in FIG. 3(A), when viewed in a plan view, the portions of source region 15 facing each other with a first recess 17 interposed therebetween are connected to each other in a region interposed between one certain first recess 17 and another first recess 17 adjacent to this one certain first recess 17. In other words, source region 15 is provided to surround first recesses 17, when viewed in a plan view. Further, body region 14 is formed in contact with source region 15. Hence, when viewed in a plan view, the portions of body region 14 facing each other with first recess 17 interposed therebetween are connected to each other in a region interposed between one certain first recess 17 and another first recess 17 adjacent to this one certain first recess 17. In other words, body region 14 is provided to surround first recesses 17, when viewed in a plan view.

Referring to FIG. 3(B), the structures of the cells will be described. As shown in FIG. 3(B), MOSFET 1 has a cell 18C, which is hypothetically hexagonal by connecting six vertices 25 to one another. Such a hypothetically hexagonal cell 18C has sides in contact with other hexagonal cells 17C. At the central portion of cell 18C, second recess 18 is formed. At the central portion of each cell 17C, first recess 17 is formed. Each of vertices 25 surrounding cell 18C is a point at which each of vertices of two cells 17C overlaps with a vertex of one cell 18C. Referring to FIG. 3(A) and FIG. 3(B), source region 15 is formed to include the vertices of hypothetically hexagonal cell 18C and cells 17C.

Further, the plurality of first recesses 17 are disposed to surround second recess 18. In MOSFET 1 of the first embodiment, first recesses 17 are disposed on sides of a hypothetical hexagon H indicated by an alternate long and short dash line so as to surround second recess 18. Further, referring to FIG. 1, gate electrode 30 is formed in first recess 17, and ohmic electrode 50 is formed in second recess 18. Namely, in MOSFET 1 of the first embodiment, six cells 17C having gate electrode 30 are formed around one cell 18C having ohmic electrode 50. Assuming that the one cell 18C and the six cells 17C disposed around cell 18C are one unit, MOSFET 1 of the first embodiment has such a shape that a plurality of such units are arranged with no space therebetween. It should be noted that cell 18C having ohmic electrode 50 serves as a contact cell for supplying current to source region 15. Each of cells 17C having gate electrode 30 serves as a channel cell for flowing current from source region 15 to drift region 13 via a channel.

Referring to FIG. 1 again, gate insulating film 20 is made of, for example, $SiO_2$ (silicon dioxide), and is disposed on and in contact with first side wall surface 17A and first bottom wall surface 17B of first recess 17 and main surface 10A of substrate 10.

Gate electrode 30 is made of a conductor such as polysilicon having an impurity added therein, and is disposed on and in contact with gate insulating film 20 so as to fill first recess 17.

Interlayer insulating film 40 is made of, for example, $SiO_2$ (silicon dioxide), and is disposed on and in contact with gate electrode 30. Specifically, interlayer insulating film 40 electrically insulates gate electrode 30 from ohmic electrode 50.

Ohmic electrode 50 is formed in contact with main surface 10A of substrate 10, source region 15, body region 14, and high-concentration second conductivity type region 16. Specifically, ohmic electrode 50 is made of a material capable of ohmic contact with source region 15, such as $Ni_xSi_y$ (nickel silicide), $Ti_xSi_y$ (titanium silicide), $Al_xSi_y$ (aluminum silicide), or $Ti_xAl_ySi_z$ (titanium aluminum silicide). Ohmic electrode 50 is electrically connected to source region 15. Further, ohmic electrode 50 is provided on and in contact with second side wall surface 18A and second bottom wall surface 18B of second recess 18.

Drain electrode 70 is formed on and in contact with main surface 11B of base substrate 11 opposite to main surface 11A thereof. Drain electrode 70 is made of, for example, the same material as that of ohmic electrode 50, and is electrically connected to base substrate 11.

Source pad electrode 60 is disposed on and in contact with interlayer insulating film 40 and ohmic electrode 50. Specifically, source pad electrode 60 is made of a conductor such as Al (aluminum), and is electrically connected to source region 15 via ohmic electrode 50.

Drain pad electrode 80 is disposed on and in contact with drain electrode 70. Specifically, as with source pad electrode 60, drain pad electrode 80 is made of a conductor such as Al (aluminum), and is electrically connected to base substrate 11 via drain electrode 70.

It should be noted that in MOSFET 1, first side wall surface 17A of first recess 17 includes a first plane having a plane orientation of {0-33-8}. More preferably, first side wall surface 17A of first recess 17 microscopically includes the first plane, and first side wall surface 17A microscopically further includes a second plane having a plane orientation of {0-11-1}. More preferably, the first plane and second plane of first side wall surface 17A of first recess 17 include a combined plane having a plane orientation of {0-11-2}. Accordingly, channel resistance in first side wall surface 17A can be reduced. Accordingly, on-resistance can be reduced.

Further, in MOSFET 1, first side wall surface 17A of first recess 17 macroscopically has an off angle of 62°±10° relative to the {000-1} plane. Accordingly, the channel resistance in first side wall surface 17A can be further reduced. Thus, the on-resistance can be further reduced.

The following describes an operation of MOSFET 1 serving as the semiconductor device according to the first embodiment. Referring to FIG. 1, when a voltage is applied between ohmic electrode 50 and drain electrode 70 while an applied voltage to gate electrode 30 is lower than a threshold voltage, i.e., while it is in OFF state, a pn junction formed between body region 14 and drift region 13 is reverse-biased. Accordingly, MOSFET 1 is in the non-conductive state. Meanwhile, when gate electrode 30 is fed with a voltage equal to or higher than the threshold voltage, carriers are accumulated along first side wall surface 17A of first recess 17 in body region 14 to form an inversion layer. As a result, source region 15 and drift region 13 are electrically connected to each other, whereby current flows between ohmic electrode 50 and drain electrode 70. In the manner described above, MOSFET 1 operates.

Figure 4:
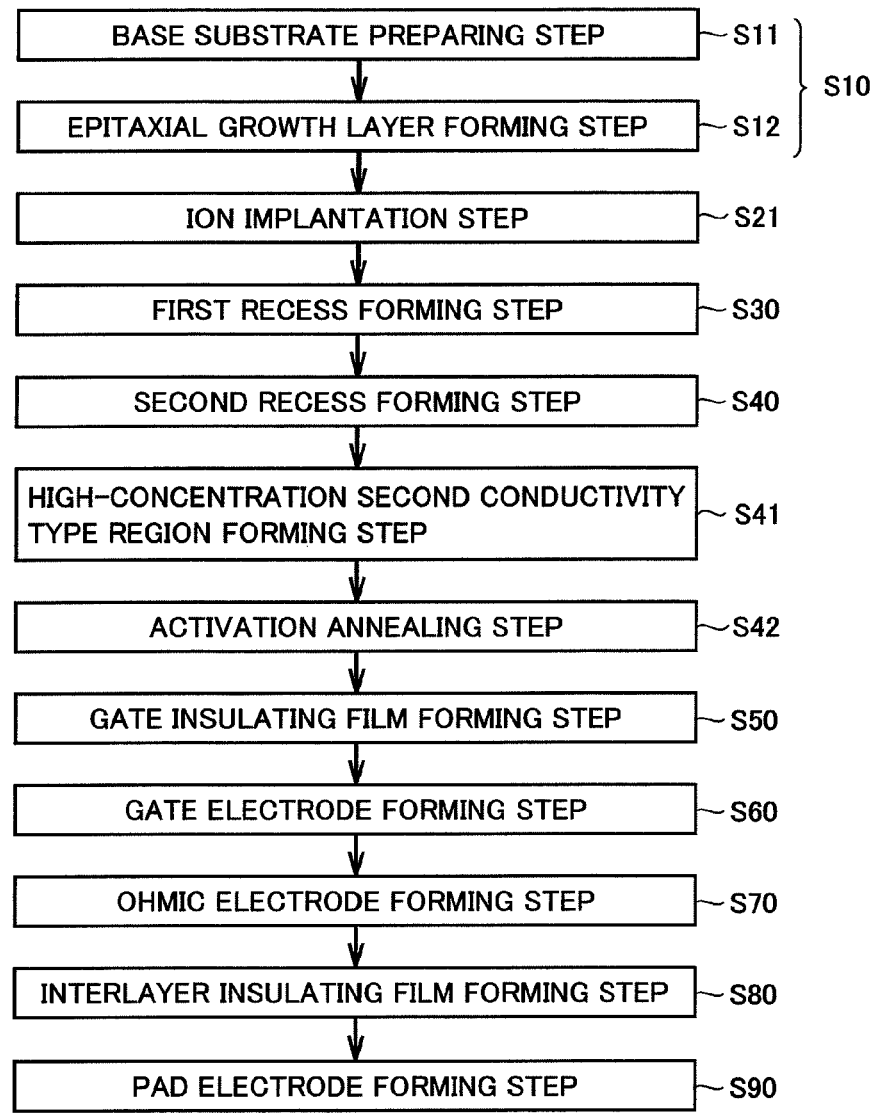
FIG. 4 is a flowchart schematically showing a method for manufacturing the semiconductor device in the first embodiment.

The following describes a method for manufacturing the semiconductor device in the first embodiment with reference to FIG. 4 to FIG. 12. In the method for manufacturing the semiconductor device in the first embodiment, MOSFET 1 serving as the above-described semiconductor device can be manufactured. Referring to FIG. 4, as a step (S10), a substrate preparing step is first performed. In this step (S10), steps (S11) and (S12) described below are performed to prepare substrate 10 made of silicon carbide.

Figure 5:
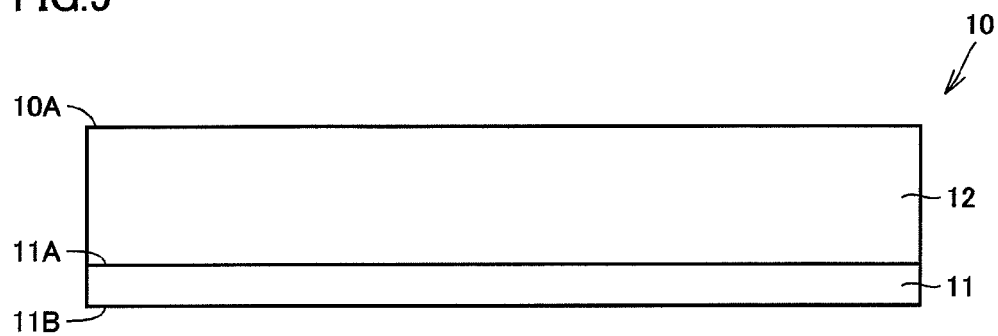
FIG. 5 is a schematic cross sectional view for illustrating a first step of the method for manufacturing the semiconductor device in the first embodiment.

First, as step (S11), a base substrate preparing step is performed. In this step (S11), an ingot (not shown) made of, for example, 4H—SiC is sliced to prepare base substrate 11 made of silicon carbide as shown in FIG. 5.

Next, as step (S12), an epitaxial growth layer forming step is performed. In this step (S12), referring to FIG. 5, semiconductor layer 12 is formed by epitaxial growth on main surface 11A of base substrate 11. In this way, substrate 10 is prepared which includes base substrate 11 and semiconductor layer 12 and has main surface 10A. It should be noted that each of base substrate 11 and semiconductor layer 12 may be made of any compound semiconductor, and is not limited to silicon carbide. For example, each of base substrate 11 and semiconductor layer 12 may be made of gallium nitride.

Figure 6:
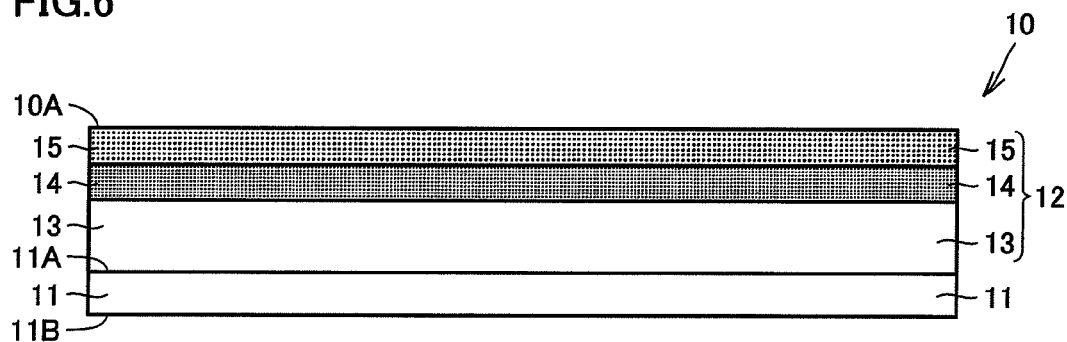
FIG. 6 is a schematic cross sectional view for illustrating a second step of the method for manufacturing the semiconductor device in the first embodiment.
Figure 7:
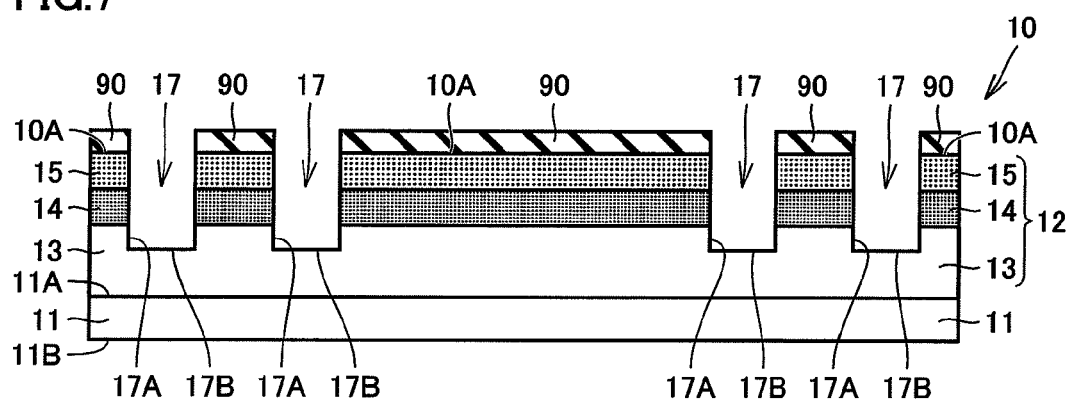
FIG. 7 is a schematic cross sectional view for illustrating a third step of the method for manufacturing the semiconductor device in the first embodiment.
Figure 8:
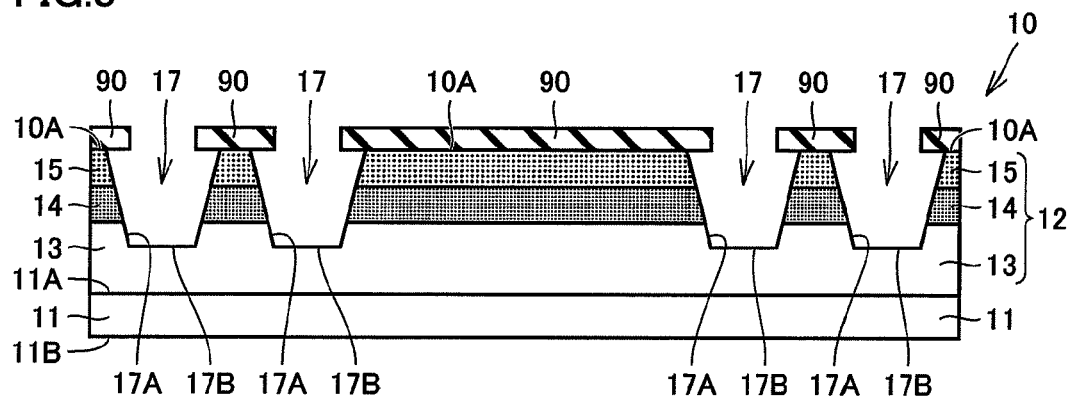
FIG. 8 is a schematic cross sectional view for illustrating a fourth step of the method for manufacturing the semiconductor device in the first embodiment.

Next, as a step (S21), an ion implantation step is performed. In this step (S21), referring to FIG. 6, for example, Al (aluminum) ions are first implanted into semiconductor layer 12, thereby forming body region 14 of p type conductivity. Next, for example, P (phosphorus) ions are implanted into semiconductor layer 12 at a depth shallower than the depth in which the Al ions have been implanted, thereby forming source region 15 of n type conductivity. Further, in semiconductor layer 12, a region in which none of body region 14 and source region 15 is formed serves as drift region 13. Thus, as shown in FIG. 6, source region 15 of n type including main surface 10A of substrate 10, body region 14 of p type making contact with source region 15, and drift region 13 of n type making contact with body region 14 are formed.

Next, as a step (S30), a first recess forming step is performed. In this step (S30), referring to FIG. 7 and FIG. 8, first recess 17 is formed in substrate 10 so as to open at the main surface 10A side. Specifically, referring to FIG. 7, a mask 90 made of $SiO_2$ (silicon dioxide) is first formed using, for example, a P-CVD (Plasma-Chemical Vapor Deposition) method. Mask 90 has openings in conformity with regions in which first recesses 17 are to be formed in main surface 10A of substrate 10. Next, for example, in an atmosphere containing $SF_6$ (sulfur hexafluoride) gas and oxygen, substrate 10 is etched by means of Inductive Coupled Plasma Reactive Ion Etching (ICP-RIE) or the like. Next, referring to FIG. 8, for example, thermal etching is performed in an atmosphere containing a halogen-based gas, such as chlorine, and oxygen. After completing this etching process, mask 90 is removed. In this way, substrate 10 is provided with first recess 17 having first side wall surface 17A and first bottom wall surface 17B at which source region 15, body region 14, and drift region 13 are exposed.

Next, as a step (S40), a second recess forming step is performed. In this step (S40), referring to FIG. 9, for example, ICP-RIE or the like is employed to etch substrate 10 so as to form second recess 18, which opens at the main surface 10A side and has second side wall surface 18A and second bottom wall surface 18B.

Next, as a step (S41), a high-concentration second conductivity type region forming step is performed. In this step (S41), referring to FIG. 9, for example, Al (aluminum) ions are implanted into a region including second bottom wall surface 18B of second recess 18 in semiconductor layer 12, thereby forming high-concentration second conductivity type region 16 having p type conductivity and extending to a region deeper than first recess 17.

Next, as a step (S42), an activation annealing step is performed. In this step (S42), by heating substrate 10, the impurities implanted in the above-described steps (S21) and (S41) are activated to generate desired carriers in the regions having the impurities implanted therein.

Next, as a step (S50), a gate insulating film forming step is performed. In this step (S50), referring to FIG. 10, for example, by heating substrate 10 in an atmosphere containing oxygen, gate insulating film 20 made of $SiO_2$ (silicon dioxide) is formed on and in contact with main surface 10A of substrate 10, first side wall surface 17A and first bottom wall surface 17B of first recess 17, and second side wall surface 18A and second bottom wall surface 18B of second recess 18.

Next, as a step (S60), a gate electrode forming step is performed. In this step (S60), referring to FIG. 11, for example, a polysilicon film having an impurity added therein is formed using an LP (Low Pressure) CVD method so as to fill first recess 17. In this way, gate electrode 30 is disposed on and in contact with gate insulating film 20.

Next, as a step (S70), an ohmic electrode forming step is performed. In this step (S70), gate insulating film 20 is first removed from the region in which ohmic electrode 50 is to be formed, thereby forming a region at which source region 15, body region 14, and high-concentration second conductivity type region 16 are exposed. Then, in this region, a metal film made of, for example, Ni is formed. Likewise, a metal film made of Ni is formed on main surface 11B of base substrate 11 opposite to main surface 11A. Then, by heating the metal films, at least portions of the metal films are silicided, thereby forming ohmic electrode 50 and drain electrode 70 both electrically connected to substrate 10.

Next, as a step (S80), an interlayer insulating film forming step is performed. In this step (S80), referring to FIG. 12, interlayer insulating film 40 is formed on gate insulating film 20 and gate electrode 30.

Next, as a step (S90), a pad electrode forming step is performed. In this step (S90), referring to FIG. 1, for example, a deposition method is employed to form source pad electrode 60, which is made of a conductor such as Al (aluminum), so as to cover ohmic electrode 50 and interlayer insulating film 40. Further, as with source pad electrode 60, for example, the deposition method is employed to form drain pad electrode 80, which is made of a conductor such as Al (aluminum), on drain electrode 70. By performing the above-described steps (S10) to (S90), MOSFET 1 is manufactured, thus completing the method for manufacturing the semiconductor device in the first embodiment.

The following describes function and effect of the semiconductor device according to the first embodiment.

According to MOSFET 1 in the first embodiment, when viewed in a plan view, the portions of source region 15 facing each other with first recess 17 interposed therebetween are connected to each other in the region interposed between first recess 17 and another first recess 17 adjacent to first recess 17. Hence, by providing ohmic electrode 50 in contact with one of the portions of source region 15 facing each other with first recess 17 interposed therebetween, current can flow in both the portions of source region 15 without providing an ohmic electrode 50 for the other portion thereof. As a result, the number of cells provided with ohmic electrodes 50 can be reduced, thus achieving size reduction of cells.

Substrate 10 of MOSFET 1 in the first embodiment is further provided with second recess 18 having second side wall surface 18A, and ohmic electrode 50 is provided in contact with second side wall surface 18A of second recess 18. Accordingly, a cell provided with ohmic electrode 50 and a cell in which a channel is formed are provided independently, thus achieving size reduction of cells.

MOSFET 1 in the first embodiment further includes high-concentration second conductivity type region 16 making contact with ohmic electrode 50 and body region 14. Accordingly, the potential of body region 14 can be fixed to a desired value.

Further, in MOSFET 1 in the first embodiment, bottom surface 16B of high-concentration second conductivity type region 16 is disposed at a location further away from one main surface 10A relative to bottom surface 17B of first recess 17. Accordingly, a depletion layer extends from a pn junction between high-concentration second conductivity type region 16 and drift region 13 of the first conductivity type, thereby relaxing electric field concentration on first bottom wall surface 17B of first recess 17.

Further, in MOSFET 1 in the first embodiment, when viewed in a plan view, the portions of body region 14 facing each other with first recess 17 interposed therebetween are connected to each other in the region interposed between first recess 17 and another first recess 17 adjacent to first recess 17. Accordingly, electric field concentration can be relaxed in a boundary between two adjacent ones of first side wall surfaces 17A forming first recesses 17. Moreover, also in the region interposed between adjacent first recesses 17, source region 15 and body region 14 are formed, thus increasing regions that can be used as channels. Accordingly, on-resistance can be reduced.

(Second Embodiment)

Figure 14:
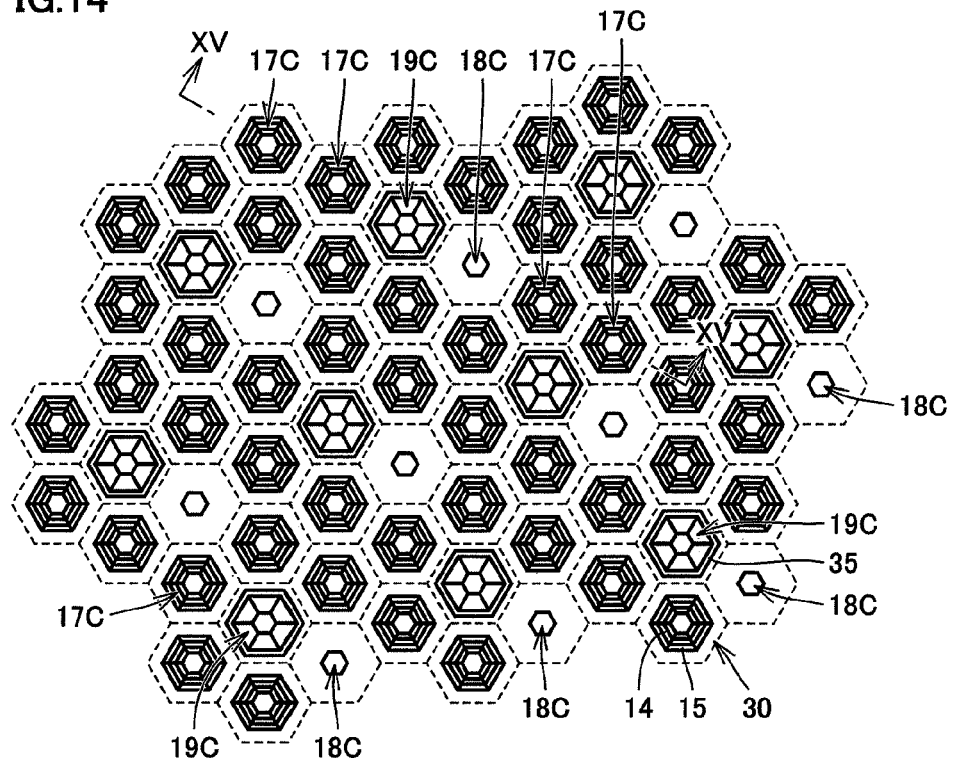
FIG. 14 is a plan view schematically showing a structure of a substrate of the semiconductor device of the second embodiment.

The following describes another embodiment of the present invention, i.e., a second embodiment. First, the following describes a structure of a MOSFET 2 serving as a semiconductor device according to the second embodiment. Referring to FIG. 14, MOSFET 2 has basically the same structure as that of MOSFET 1 of the first embodiment. However, MOSFET 2 is different from MOSFET 1 in that MOSFET 2 includes a passive cell 19C between a contact cell 18C and a channel cell 17C as shown in FIG. 14. It should be noted that passive cell 19C refers to a cell mainly having a function of electric field relaxation.

Figure 15:
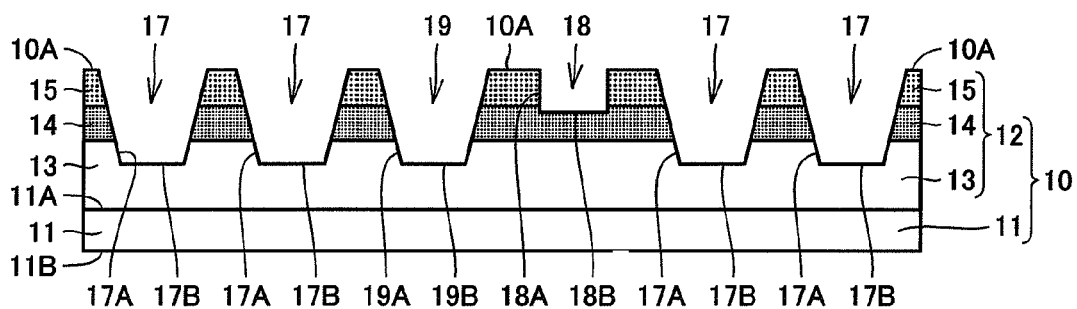
FIG. 15 is a schematic cross sectional view for illustrating the method for manufacturing the semiconductor device in the second embodiment (cross sectional view of a region of FIG. 14 along XV-XV).

Referring to FIG. 15, in addition to first recesses 17 and second recess 18, substrate 10 is provided with a third recess 19, which opens at main surface 10A. Third recess 19 has third side wall surfaces 19A and a third bottom wall surface 19B. In the second embodiment, a distance from main surface 10A of substrate 10 to third bottom wall surface 19B is substantially the same as a distance from main surface 10A of substrate 10 to first bottom wall surface 17B. The distance from main surface 10A of substrate 10 to third bottom wall surface 19B may be longer than the distance from main surface 10A of substrate 10 to first bottom wall surface 17B.

Figure 13:
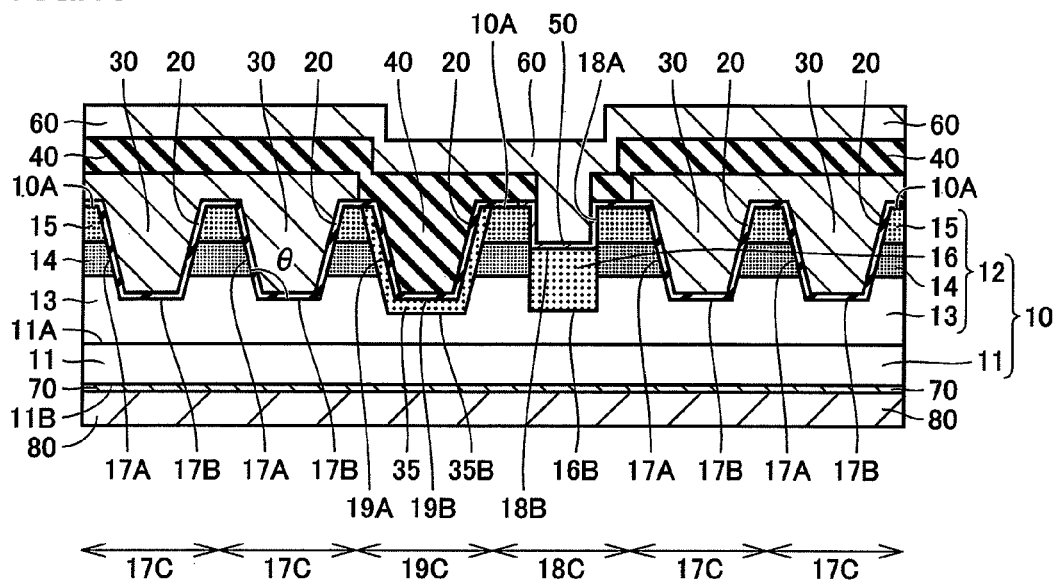
FIG. 13 is a schematic cross sectional view showing a structure of a semiconductor device of a second embodiment.

Referring to FIG. 13, electric field relaxing region 35 is disposed in contact with third side wall surface 19A and third bottom wall surface 19B. Electric field relaxing region 35 has the same conductivity type as that of body region 14, and has an impurity concentration higher than that of body region 14. Further, electric field relaxing region 35 makes contact with source region 15, body region 14, and drift region 13. Further, bottom surface 35B of electric field relaxing region 35 is disposed at a location further away from main surface 10A of substrate 10 relative to first bottom wall surface 17B of first recess 17. In other words, bottom surface 35B of electric field relaxing region 35 is disposed closer to drain electrode 70 relative to the first bottom wall surface.

In third recess 19, insulating film 20 is formed in contact with third side wall surface 19A and third bottom wall surface 19B. Insulating film 20 is, for example, $SiO_2$. Third recess 19 is not provided with gate electrode 30, unlike first recess 17. Third recess 19 is filled with insulating films 20, 40. Hence, no channel is formed in the cell (passive cell 19C) having third recess 19.

Referring to FIG. 14, in MOSFET 2 of the second embodiment, passive cells 19C are periodically provided adjacent to contact cells 18C. The number of passive cells 19C is smaller than the number of channel cells 17C, and the number of contact cells 18C is also smaller than the number of channel cells 17C. As shown in FIG. 15, when MOSFET 2 of the embodiment is viewed in a plan view, five channel cells 17C and one passive cell 19C are disposed around one contact cell 18C. Assuming that one contact cell 18C, five channel cells 17C, and one passive cell 19C are one unit, MOSFET 2 of the second embodiment has such a structure that such units are arranged with no space therebetween, when viewed in a plan view.

The following describes a method for manufacturing MOSFET 2 serving as the semiconductor device in the second embodiment. The method for manufacturing MOSFET 2 in the second embodiment is basically the same as the method for manufacturing MOSFET 1 in the first embodiment. However, the method for manufacturing MOSFET 2 is different from the method for manufacturing MOSFET 1 in that the method for manufacturing MOSFET 2 includes the step of forming electric field relaxing region 35.

For example, before performing the activation annealing step (S42), an electric field relaxing region forming step is performed. In this step, for example, Al (aluminum) ions are implanted into semiconductor layer 12 at a region including third side wall surface 19A and third bottom wall surface 19B of third recess 19, thereby forming electric field relaxing region 35 of p type extending to the region deeper than first bottom wall surface 17B of first recess 17.

The following describes function and effect of the semiconductor device according to the second embodiment.

According to MOSFET 2 in the second embodiment, substrate 10 further includes electric field relaxing region 35 having second conductivity type and disposed in contact with third side wall surface 19A of third recess 19 and body region 14. By providing the cell specialized in electric field relaxation, electric field concentration can be suppressed more securely.

In MOSFET 2 according to the second embodiment, bottom surface 35B of electric field relaxing region 35 is disposed at a location further away from one main surface 10A relative to bottom surface 17B of first recess 17. Accordingly, a depletion layer extends from a pn junction between electric field relaxing region 35 of the second conductivity type and drift region 13 of the first conductivity type, thereby relaxing electric field concentration on first bottom wall surface 17B of first recess 17.

The semiconductor device of the present invention is particularly advantageously applicable to a semiconductor device required to allow for size reduction.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
    a substrate made of a compound semiconductor and having
        a plurality of first recesses, each of which opens at one main surface thereof and has a first side wall surface;
    a gate insulating film disposed on and in contact with said first side wall surface; and
    a gate electrode disposed on and in contact with said gate insulating film, said substrate including
        a source region having first conductivity type and disposed to be exposed at said first side wall surface and face itself with a first recess interposed therebetween, when viewed in a cross section along a thickness direction, and
        a body region having second conductivity type and disposed in contact with said source region at a side opposite to said one main surface when viewed from said source region, so as to be exposed at said first side wall surface and face itself with said first recess interposed therebetween,
    portions of said source region facing each other with said first recess interposed therebetween being connected to each other in a region interposed between said first recess and another first recess adjacent to said first recess when viewed in a plan view, and
    a portion of said source region surrounding said first recess is directly connected to a portion of said source region surrounding said another first recess adjacent to said first recess when viewed in a plan view, wherein
    said substance is further provided with a second recess having a second side wall surface, and
    said source region is exposed at said second side wall surface,
    the semiconductor device further comprising an ohmic electrode, which is formed on said second side wall surface and makes ohimc contact with said source region.

2. The semiconductor device according to claim 1, further comprising a high-concentration second conductivity type region, which makes contact with said ohmic electrode and said body region.

3. The semiconductor device according to claim 2, wherein said high-concentration second conductivity type region has a bottom surface disposed at a location further away from said one main surface relative to a first bottom wall surface of said first recess.

4. The semiconductor device according to claim 1, wherein portions of said body region facing each other with said first recess interposed therebetween are connected to each other in the region interposed between said first recess and the another first recess adjacent to said first recess when viewed in a plan view.

5. A semiconductor device comprising:
    a substrate made of a compound semiconductor and having
        a plurality of first recesses, each of which opens at one main surface thereof and has a first wall surface;
    a gate insulating film disposed on and in contact with said first side wall surface; and
    a gate electrode disposed on and in contact with said gate insulating film, said substrate including
        a source region having first conductivity type and disposed to be exposed at said first side wall surface and face itself with a first recess interposed therebetween, when viewed in a cross setion along a thickness direction direction, and
        a body region having second conductivity type and disposed in contact with said source region at a side opposite to said to said one main surface when viewed from said source region, so as to be exposed at said first side wall surface and face itself with sad first recess interposed therebetween,
    portions of said source region each other with said first recess interposed therebetween being connected to each other in a region interposed between said first recess and another first recess adjacent to said first recess when viewed in a plan view, and
    a portion of said source region surrounding said first recess is directly connected to a portion of said source region surrounding said another first recess adjacent to said first recess when viewed in a plan view, wherein
    said substrate is further provided with a third recess that opens at said one main surface and has a third side wall surface, and
    said substrate further includes an electric field relaxing region, which has the second conductivity type and is disposed in contact with said third side wall surface of said third recess and said body region.

6. The semiconductor device according to claim 5, wherein said electric field relaxing region has a bottom surface disposed at a location further away from said one main surface relative to a first bottom wall surface of said first recess.

* * * * *